United States Patent [19]

Woodman, Jr.

[11] 4,080,730
[45] Mar. 28, 1978

[54] MACHINE FOR ASSEMBLING COMPONENTS

[75] Inventor: Daniel Wayne Woodman, Jr., Beverly, Mass.

[73] Assignee: USM Corporation, Boston, Mass.

[21] Appl. No.: 721,071

[22] Filed: Sep. 7, 1976

[51] Int. Cl.² .............................................. H05K 3/30
[52] U.S. Cl. ....................................... 29/701; 29/741; 29/760; 29/799
[58] Field of Search ................. 29/701, 702, 703, 739, 29/740, 741, 760, 626, 799; 33/1 M

[56] References Cited

U.S. PATENT DOCUMENTS

| | | | |
|---|---|---|---|
| 3,691,864 | 9/1972 | Cochran et al. | 29/760 X |
| 3,722,062 | 3/1973 | Gharaibeh | 29/703 |
| 3,740,817 | 6/1973 | Weiler et al. | 29/701 X |
| 3,972,100 | 8/1976 | Zemek et al. | 29/739 X |

Primary Examiner—Carl E. Hall

Attorney, Agent, or Firm—Carl E. Johnson; Richard B. Megley; Vincent A. White

[57] ABSTRACT

Intermediate a component inserting machine and its lead clinching mechanism, a turret-type work support carries one or more detachable circuit boards and is rotatable about a vertical axis as well as movable in their general plane under the control of programmed power means. The latter is effective to cause a pivot means on the support and a cooperative surface or stop means to shift the support and its boards angularly at predetermined times and to a predetermined extent. Accordingly, without need to angularly reposition the inserter or clinching means, the automatically positioned work support enables the boards to receive components in various predetermined angular relations (most commonly at right angles), and boards may be loaded and unloaded on the turret while other boards thereon are concurrently having components mounted therein.

The arrangement avoids the hazard present when boards are manually repositioned, and generally enhances productivity.

16 Claims, 10 Drawing Figures

MACHINE FOR ASSEMBLING COMPONENTS

BACKGROUND OF THE INVENTION

This invention relates to automatic assembly of articles such as electrical components in angular relation on holders such as printed circuit boards.

Large numbers of electronic components have their coaxial or multiple leads mounted by machines which form and insert the free ends of the leads through preformed holes for connection with the circuitry of printed circuit boards. Some of these machines have heads adjustable angularly, manually or by power means, about axes normal to the plane of the boards. In some cases the machines themselves are bodily repositioned each time insertion is to occur, or more commonly a conveyor or cross slide means is provided for X-Y orienting a board with respect to the lead inserting and the lead clinching means. It is also known, as shown in U.S. Pat. No. 3,859,707 for instance, to provide a rotary circuit board holder which is manually turnable about an axis to enable components to be mounted in a board with different orientation, but not without some risk of injury to an operator's hands as well as inconvenience and possible inaccuracy.

Examples of disclosures pertaining to automatically controlled pantograph positioning of circuit boards on X-Y axes are found, for example, in U.S. Pat. Nos. 3,727,284 and 3,789,483. Such arrangements ordinarily dispose component bodies when mounted only along one coordinate (i. e. parallel to each other), but may require a 90° (for instance) or other angular shifting of the mounting board relative to an inserter or applicator to fulfill a requirement of right angular or selected disposition and more intensive use of the board surface.

SUMMARY OF THE INVENTION

In view of the foregoing, it is an object of this invention to provide a versatile machine for automatically mounting articles in predetermined planar orientation.

Another object is to provide, in combination with means for inserting component leads in circuit boards, a rotatable and orthogonally positionable work support for carrying one or more boards to space them in a plane and about an axis aligned or registering with the inserting means, and a programmed power means for automatically and predeterminedly shifting the support both orthogonally and angularly about the axis when the inserting means is retracted from the support.

A feature of the invention resides in providing an automatic assembling machine including a reciprocable applicator with a rotary work support, programmable means for predeterminedly positioning the support along coordinate X-Y axes and relative to the operating path of the applicator, and mechanism responsive to programmed operation of the positioning means for causing the support to predeterminedly rotate about a Z-axis parallel to the operating path of the applicator. As herein shown the support may be caused to rotate clockwise and counter-clockwise about an axis passing through the center of the support; furthermore, the support is predeterminedly revolvable about a Z-axis non-coincident with the center of the support.

BRIEF DESCRIPTION OF THE DRAWINGS

The foregoing and other features of the invention will now be more particularly described in connection with an illustrative machine for electronic component assembly, and with reference to the accompanying drawings thereof, in which.

DESCRIPTION OF PREFERRED EMBODIMENT

Figure 1:
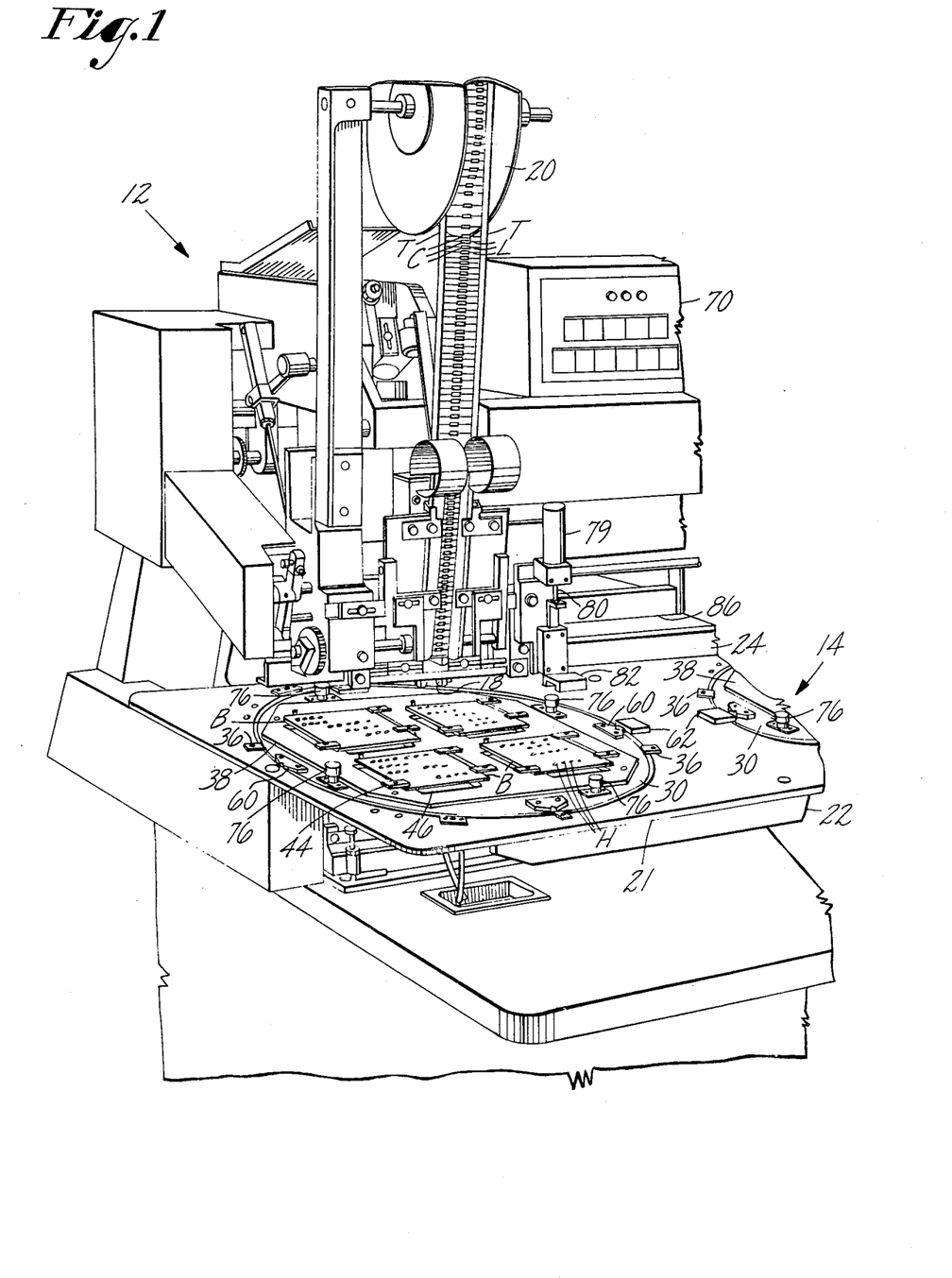
FIG. 1 is a prespective view of a portion of a component inserting machine, comprising computercontrolled means for positioning work supports and articles thereon such as circuit boards along X-Y axes and in predetermined angular relation relative to a Z-axis.
Figure 2:
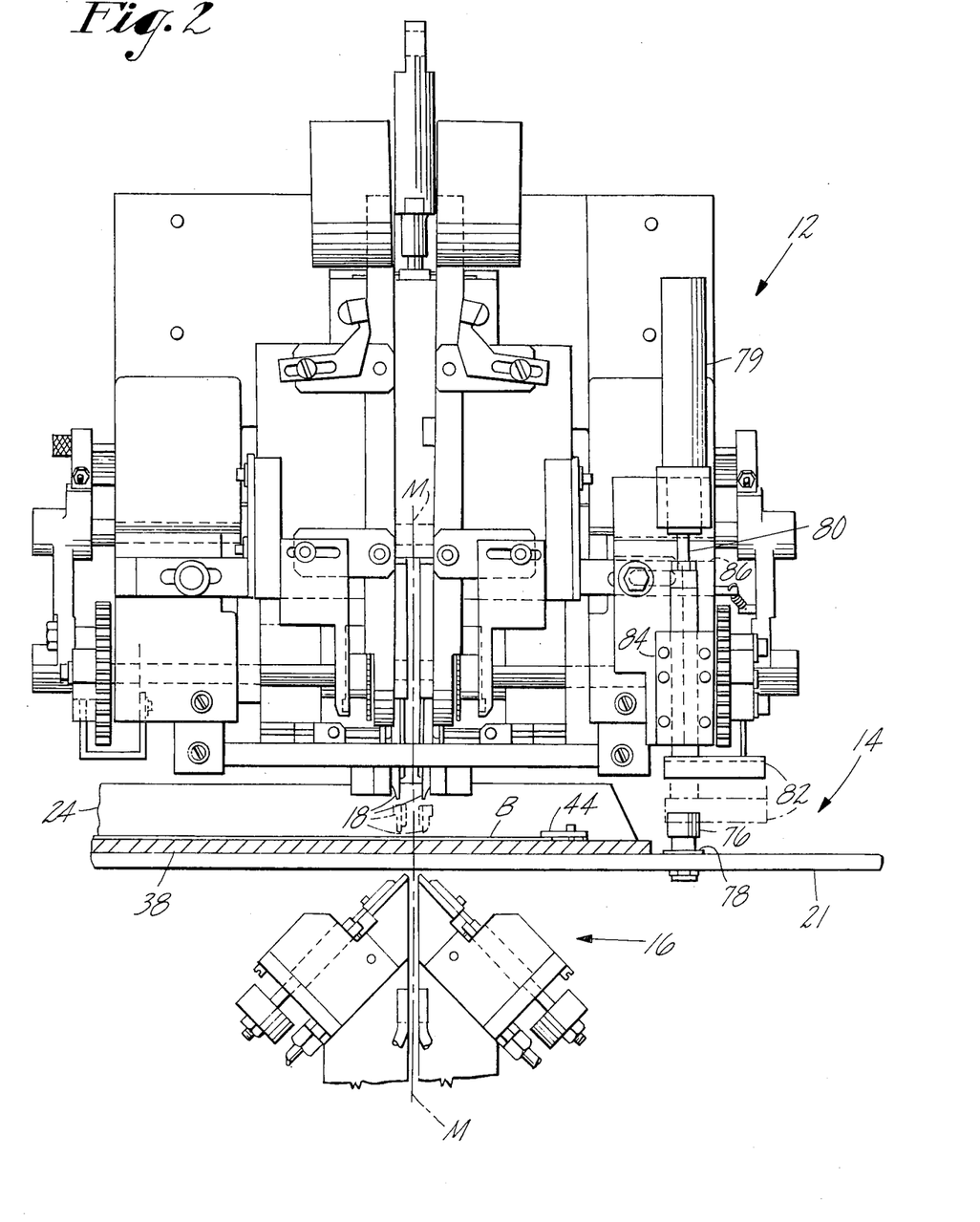
FIG. 2 is a view in front elevation of a portion of the machine shown in FIG. 1 and indicating a lead clinching mechanism in relation to inserting means and a work support means, and showing in phantom the cooperative relation of a portion of mechanism for angularly shifting the orientation of the support and circuit board which is to receive a next component or components to be inserted and clinched.
Figure 3:
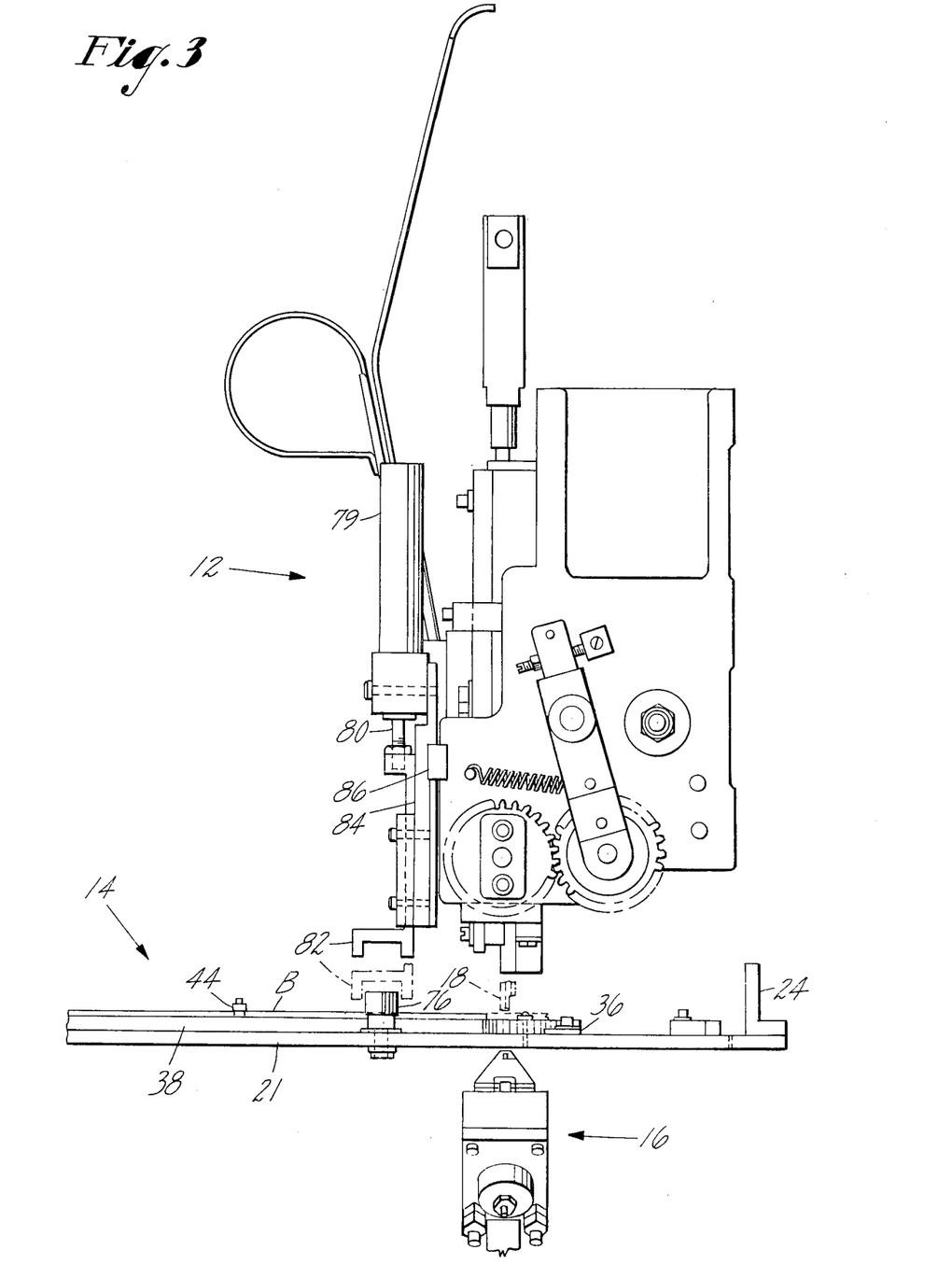
FIG. 3 is a view in side elevation of the machine portions illustrated in FIG. 2 and showing a pivot roll of the work support means in position to be restrained by a lowered yoke or crosshead during angular shift.

Referring first to FIGS. 1-3, a component inserting machine, preferably of variable center distance type (though it may be of fixed head type and could handle DIP-type as well as coaxial lead components), generally designated 12 is mounted for operation above a numerically controlled work supporting carriage 14 to be later described. Preferably lead clinching mechanism 16 is arranged for cutting and/or clinching the downwardly projecting end portions of leads L which have been thrust through a circuit board B secured on the carriage 14. The present illustration shows, preferably in two laterally spaced groups to be processed, a plurality of boards B respectively preformed with appropriately and precisely spaced lead receiving holes H which may be arranged in orthogonal and/or other angular relation as necessary to enable electrical connection of the component leads to a circuit disposed on the respective boards. While the invention accordingly will be described as applied to locating components C on circuit boards and with predetermined orientation thereon, it will be understood that the invention is also applicable more generally to mounting fasteners or other articles in predetermined relation on workpieces positionable with respect to any of a variety of applicator means.

In the illustrative apparatus the machine 12 is assumed to comprise a vertically reciprocable driver or inserter and lead formers 18,18 operable along a fixed median axis M (FIGS. 2 & 5) that is aligned with the vertical median of the clinching mechanism 16. The components C to be mounted are successively supplied to the machine head as by tapes T,T (FIG. 1) from a reel 20 to deliver the leads L of each component for appropriate lead leg forming and spacing which, in accordance with known mechanism, may be varied to accord with the intended spacing of the board holes H. It will be understood that the components C may be of coaxial lead type, or have at least partial coaxial lead configuration.

Figure 4:
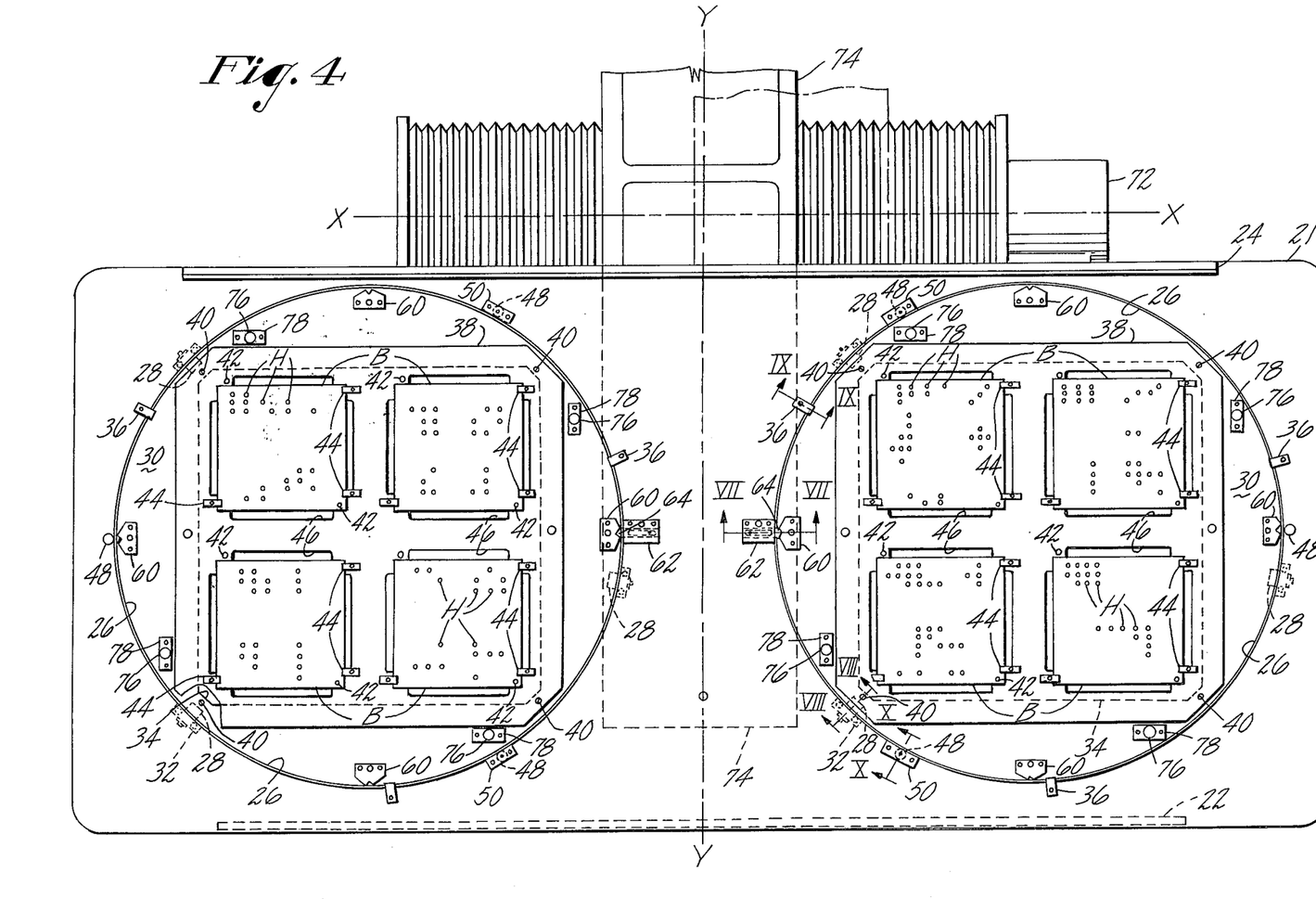
FIG. 4 is a plan view of the dual turret-type or disc work supports and their work holding fixtures, the locus of a turret or disc center being shown in dash lines preparatory to effecting 90° shift (or 180° shift) in clockwise rotation of a work support disc.
Figure 8:
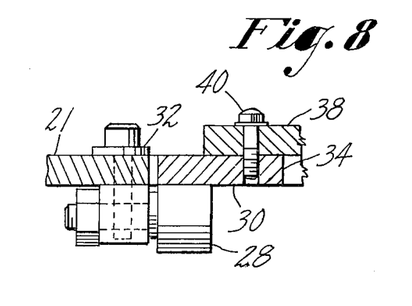
FIG. 8 is a section taken on the line VIII—VIII of FIG. 4 and showing bearing means supporting the disc.
Figure 9:
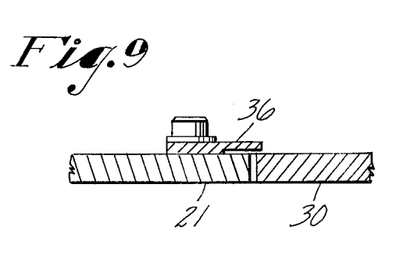
FIG. 9 is a section taken on the line IX—IX of FIG. 4 and showing a board hold down.

The work supporting carriage 14 comprises a horizontal board holding fixture in the form of an elongated plate 21 (FIGS. 1-10) of aluminum, for instance, having a front stiffening rib 22 and a rear stiffening rib 24. As shown in FIG. 4 the plate 21 is formed with a pair of laterally spaced circular openings 26,26, each commonly being on the order of about one foot or more in diameter. They may be of different size, but for versatility in accommodating one or a plurality of boards B, each opening desirably is greater in area than, say, at least two of the boards to be processed. For present purposes it may be presumed that the right and left work supporting arrangement being described are similar. As illustrated in FIGS. 4 and 8, beneath each opening 26 are three circumferentially spaced rollers 28 for rotatably supporting a disc 30 at its periphery. For this purpose a block 32 (FIG. 8) secured to the plate 21 provides a bore in which an axle of the rollers 28, respectively, is journalled. The disc 30 is itself formed with an opening 34 in this case shown as generally square-shaped but which may be of substantially any desired configuration not obstructing access to the boards B by the clinching mechanism 16. Diametrically disposed hold downs 36,36 (FIG. 9) overhang an edge of the disc 30 and are pivotally secured to the plate 21 to permit disc removal. A printed circuit board locating blank 38 (FIGS. 1-6) is interchangeably mounted on each disc 30 as by means of screws 40 and a pair of dowel pins extending upwardly from the disc. Each blank 38 is provided with suitable means for detachably but fixedly locating thereon one or more of the boards B; in this instance each of four boards B is shown positioned exactly on the blank 38 by a pair of spaced pins 42 and three spaced clamping latches 44. The latter are pivotally secured on the blank and have their board engaging ends arranged to abut a margin of the board which itself spans an aperture 46 in the blank.

Figure 10:
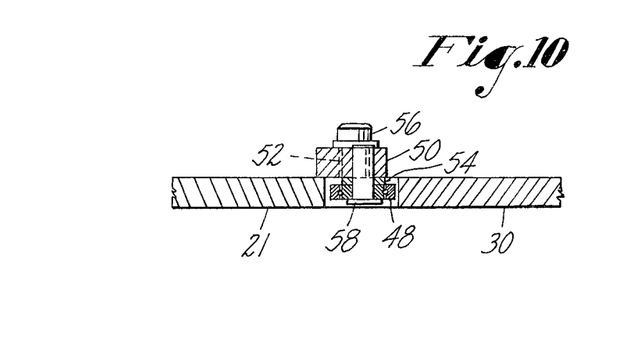
FIG. 10 is a section taken on the line X—X of FIG. 4 and showing an adjustable one of three radial thrust bearings for the work support disc.

Referring to FIGS. 4 and 10, each disc 30 is rotatably supported in the general plane of the plate 21, the circumference of the disc being engageable by three spaced radial thrust bearings 48 rotatably carried by bearing blocks 50, respectively, secured to the plate. Two of the three bearings 48, such as that illustrated in FIG. 10, are adjustable radially of the disc to insure accurate alignment of the disc center for positioning purposes later explained. For this purpose radial clearances 52 are formed for receiving mounting screws 56 in the block 50, a spacing washer 54 is provided, and a stud 58 carrying the bearing is pressed into the block to hold the bearing in selected radial position.

Figure 7:
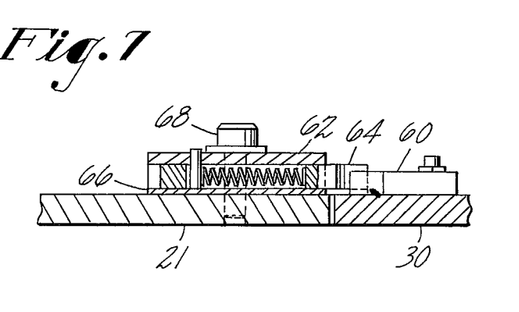
FIG. 7 is a section taken on the line VII—VII of FIG. 4 and showing an indexing latch means for releasably locating and holding an angular position of the work supporting disc.

As shown in FIG. 7 each disc 30 is releasably latchable to the plate 21 at 90° positions. Thus, for this purpose four V-notched blocks 60 are equispaced upon the respective discs 30,30. A block 62 secured to the plate 21 adjacent to the inner portion of the perimeter of each of the discs 30 carries a spring-pressed plunger 64 adapted to releasably engage with the V-notch of the adjacent block 60 when the disc and the work carried thereon is indexed, for instance, 90°, by automatic means to be described. It will be apparent that other angular holding positions than at 90° intervals may be established when indexing needs so dictate. Th plunger 64 preferably is movable on a hardened slide plate 66 (FIG. 10) anchored between the block 62 and the plate 21 by a bolt 68. It will further be understood that, when operating demands may require upon occasion, the board locating blanks 38 need not mount the boards B in parallel or orthogonal arrangement as illustrated, but may have their pins 42 and latches 44 arranged to angularly orient the boards B predeterminedly in any selected manner about the Z-axis passing through the center of the discs 30 or about an axis parallel to the Z-axis.

For orthogonally controlling positioning of the work supporting carriage 14 with respect to the inserter or applicator means and the clinching mechanism 16, the machine 12 comprises known automatic X-Y programming means, for instance, a tape reader computer 70 partly shown in FIG. 1. In conventional manner in response to a signal from the computer, movement of the plate 21 along an X-ordinate, i. e. parallel to the fixed X—X axis (FIG. 4) of a shaft (not shown) controlled by a servo motor 72 (FIG. 4) is effected. Similarly, and simultaneously if the predetermined program so dictates, a Y-axis servo motor (not shown) moves the plate 21 parallel to the Y-Y axis indicated in FIG. 4, a Y-cross slide 74 (FIGS. 4-6) being connected to the plate 21 for this purpose.

The present invention by means next described makes advantageous use of such known X-Y programming means to effect automatically predetermined angular movement of the discs 30 and the circuit boards B mounted thereon about a Z-axis passing through the centers of the discs, respectively. The operation of the angular or Z-axis programming will be explained for 90° or 180° shifts of the boards B, since such mode of operation seems most commonly practiced, it being understood that other angle orientation can be similarly effected by use or appropriate programming and disc latching means. While a single pivot means such as a projection on a disc 30 may suffice in some cases, there is desirably mounted in each quadrant of the discs 30 a pivot or projection in the form of an upstanding pivot roll 76 (FIGS. 1-5) preferably having a rotatable outer race. A stem mounting the roll is press fit into a hole in the disc, and a spacer 78 is disposed between the roll and the disc. As herein shown the rolls 76 are disposed adjacent to an outside edge of the blank 38 but extending above it. It will be appreciated that the choice of diposition of the rolls (or equivalent pivot means or projecting elements) and of mechanism cooperating therewith as will shortly be described may differ in various embodiments of this invention without departing from its scope, a particular arrangement and programming being selected to suit convenience in design and avoidance of interference with other structural members. Assuming that the left hand disc 30 (FIG. 4) and the blank 38 thereon to have been latched in selected angular relation to the plate 21 while one or more of the boards B were shifted parallel to the X-Y axes by the computer programming means until all desired components C have been inserted with corresponding orientation, the program may next call for rotating that disc 90° (or 180°), and hence the blank 38 and its boards B, for the reception of additional components. (It will be understood similar programmed operation would control X-Y movements of the other disc 30 and the Y-axis shifting of the discs for successive operations thereon, and presumably as convenient to an operator in loading or removing boards.) Accordingly, the program will next cause the axis of that roll 76 then nearest the median operating axis M (FIGS. 2,5) of the machine 12 to be moved to a fixed point P (FIG. 5) which is a constant predetermined X and Y distance from the axis M. With the axis of the roll 76 coincident with the point P, the computer 70 signals for actuation of a double-acting air cylinder 79 (FIGS. 1–3) to lower its piston rod 80 against influence of a return spring (not shown) and hence a U-shaped stop or yoke 82 secured on an end of the rod into operative roll guiding relation to the located roll 76 as shown in dash lines in FIGS. 2,3. The cylinder 79 is mounted on a bracket 84 connected to a machine member, for instance a raceway guide block 86 (FIGS. 1–3) fixed against heightwise movement.

Figure 5:
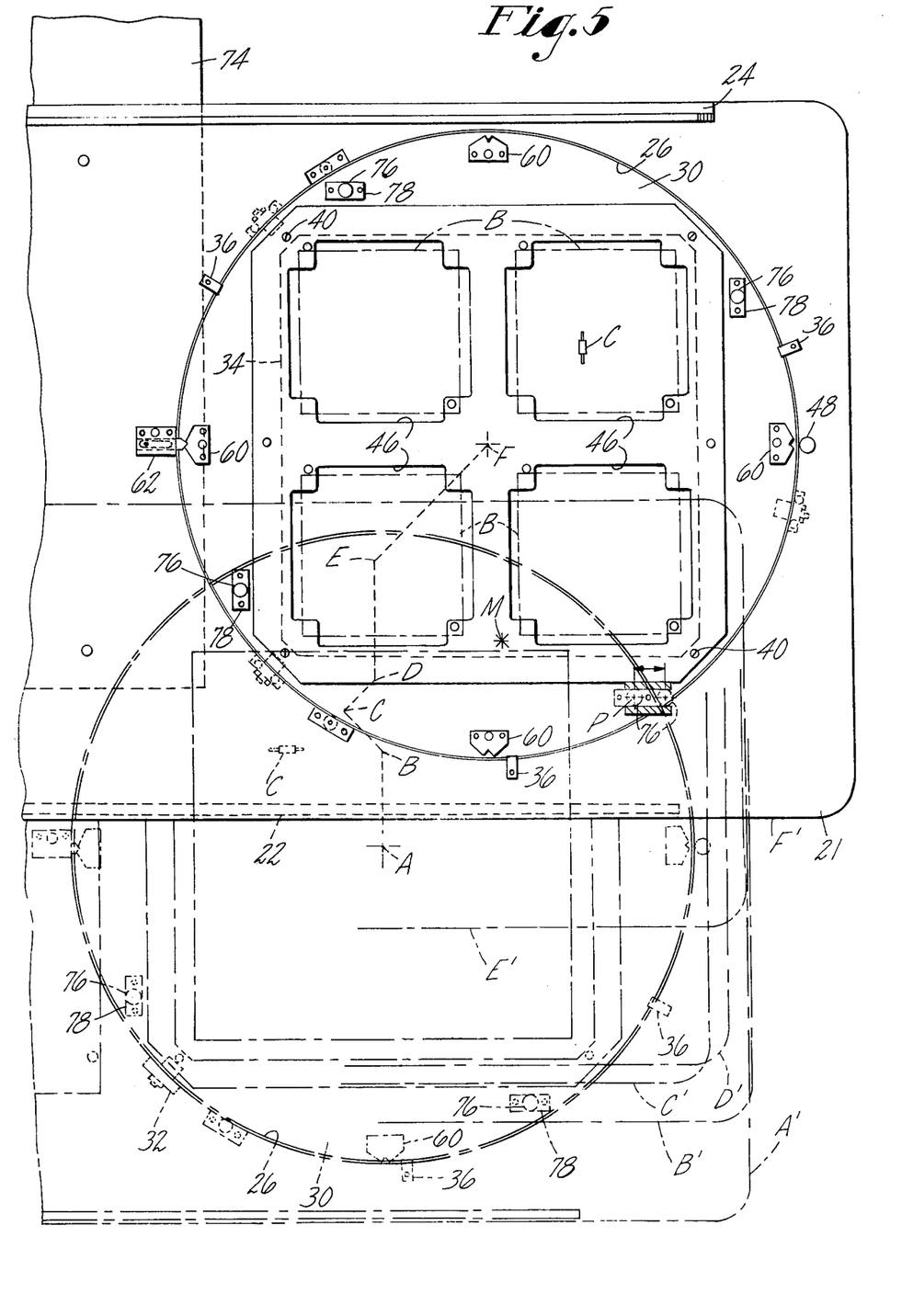
FIG. 5 is an enlarged plan view showing successive hypothetical positions during the angular orientation of a board-carrying disc effected by the programmed cooperation of the pivot roll and the crosshead.
Figure 6:
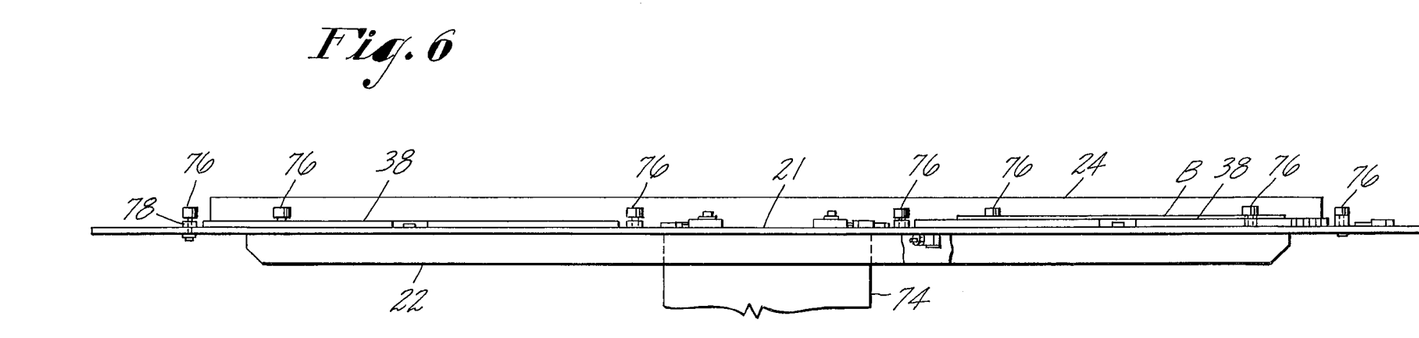
FIG. 6 is a view in front elevation of the work holding fixture.

The function of the lowered yoke 82, in this instance, is to cage the located roll 76 then slidably engaged thereby as shown in FIG. 5 against movement in the Y-axis direction while permitting its X-axis motion during programmed X-Y movement of the plate 21 for effecting rotation of the disc 30 about its own moving center, i.e. about a Z-axis parallel to the M axis. For purposes of illustration, and with particular reference to FIG. 5, to effect a 90° shift of the disc clockwise, the tape reader computer 70 is programmed to move the plate and hence the disc center successively through points A, B, C, D, E and F. FIG. 5 also shows corresponding successive positions ($A^1$, $B^1$, $C^1$, $D^1$, $E^1$ & $F^1$) of the plate 21 as the disc 30 is thus caused to revolve about the caged roll 76, or more accurately about its axis while held against Y-movement and during idle or incidental X-movement. It will be apparent that other programs than that corresponding to movement successively through points A, B, C, D, E, F may be selected for effecting the disc shift about the Z-axis and to avoid a particular interfering obstruction. The result of the angle shift is illustrated, for instance, by noting that an inserted component C shown in horizontal orientation in the upper left board B of FIG. 5 (corresponding to disc center position A) will be turned 90° to its vertical position in the upper right board B when the point A has arrived at point F. In other words, for 90° shifting of any pair of lead-receiving holes H, the computer 74 may be similarly programmed to enable the roll axis to be located at the predetermined point P whereupon, following caging by the stop or yoke 82, further X-Y programmed movement of the plate 21 rotates the disc the required degree about the Z-axis passing through the center A of the disc. Often, though not necessarily, the programmed disc center locus (such as A, B, C, D, E, F) will conveniently be comprised of rectilinear paths which extend at angles each of which is 45° or a multiple thereof. The turning torque effects release of the disc from its initially latched condition until at the next indexed position, at the end of 90° disc rotation, the plunger 64 releasably engages with the next V-notched block 60. For causing 180° rotation of a disc 30 it will be apparent that a repeat of the 90° programming is or may be used.

It should be noted that FIG. 5 depicts only one hypothetical programming whereby the data-controlled computer 70 effects a 90°0 clockwise rotation of the disc 30, and that clearly the machine 12 cannot at that moment in operations make insertion of a component C since the operating axis M will then be intersecting the blank 38. Accordingly further data from the computer tape will, as soon as the yoke 82 is lifted, next move the re-oriented and re-latched disc 30 in its X-Y plane to correctly register or align the next lead-receiving holes H with the inserter and lead formers 18 before signaling for their actual descent and operation.

One way of many in which the invention may be employed will now be briefly reviewed. Assuming the board or boards B have been mounted on the holding blank 38 in selected angular relation thereto, the computer 70 will be programmed to move the plate 21 and hence its blank-carrying discs 30 into successive X, Y positions wherein the machine can insert formed leads L into the board holes H. It will be apparent that an operator has a choice whereby his program will call for inserting all like-oriented components (for instance, along an X ordinate only) in the successive boards of one disc 30 or of both discs 30 before his controlling tape will dictate that a disc should be angularly shifted, for example 90°, about its center or Z-axis. In general, a plan of operation will have been settled upon for programming which will enable the attendant simply to load boards initially upon a blank 38 as successive boards with completely applied components C thereon become clear and conveniently accessible for easy manual or other removal.

When the computer signals for a board to be angularly turned 90° about the Z-axis, the plate 21 is moved with components of X, Y motion (preferably along a locus comprising paths related angularly by 45° or multiples thereof) to locate the axis of a roll 76 (desirably that roll then nearest the machine operating axis M) at the known point P fixedly spaced from axis M. The computer then signals for the cylinder 79 to lower the yoke 82 to cage the located roll against (in this case) Y-motion. The caged roll 76 is then permitted idly to move in either right or left Y-axis direction as the computer controls movement of the disc center through selected points, for instance, A, B, C, D, E and F. With the center at F, the disc 30 will have carried its blank 38 and board(s) B thereon 90° about the point P. The computer may then signal for air pressure in the cylinder 79 to raise the yoke 82 to an out-of-the-way position, whereupon further programming signals further shifting of the plate 21 in its X-Y plane to locate re-oriented lead receiving holes H beneath the applicator and formers 18. It will be appreciated that following insertion of the leads, the cut-clinch means 16 will be actuated in conventional manner in response to signal from the computer.

The invention thus provides automated board or workpiece positioning about a Z-axis by means of programmed X-Y board locating mechanism. Not only is versatility of known inserting or applying machines enhanced, but the invention provides a convenient way to schedule board loading and unloading, automatically avoid any ordinary mechanical element which might otherwise obstruct angular board positioning, and tends to prevent injury to an operator's hands were he to manually position the successive boards as angularly required.

I claim:

1. In a machine for assembling articles in predetermined angular relation on a workpiece, a carriage movable in an X-Y plane, a work support mounted on the carriage for movement about a Z-axis, means movable toward and from the work support for applying articles to the workpiece carried by the support, power means for controlling programmed X-Y movements of the carriage and said support, a pivot projection extending from the support, and means associated with the machine and cooperative with the projection in response to the programmed X-Y movement of the carriage and support for automatically rotating the latter a predetermined angle about its Z-axis.

2. A machine as in claim 1 wherein said means cooperative with the projection is movable into engagement therewith when the article applying means is retracted from the work.

3. A machine as in claim 1 wherein the projection is a roll rotatably mounted in the support for turning about an axis normal to the X-Y plane, and said means cooperative with the projection is in the form of a stop or caging means providing a guide for enabling the support to rotate about an axis passing through the roll.

4. A machine as in claim 1 wherein the programmed X-Y locus of movement of the carriage and support for effecting rotation of the latter 90° about the Z-axis is a composite of rectilinear paths extending at angles each of which is 45° or a multiple thereof.

5. A machine as in claim 1 wherein said means cooperative with the projection is adapted to restrain it against movement along one of the X, Y ordinates and arranged to guide it along the other X, Y ordinate.

6. A machine as in claim 1 wherein the work support is in the form of a rotary disc having roller bearing support on a cross slide of said carriage, and detent means on the slide constructed to permit reversible rotation of the disc is arranged to cooperate with retaining means on the disc yieldably to hold the latter in selected angular relation on the slide as determined by operation of said power means.

7. A machine as in claim 2 wherein mechanism is provided for automatically moving the stop or caging means into and out of position for operative engagement with the projection.

8. A machine as in claim 5 wherein the mechanism for moving said stop or caging means is responsive to said power means.

9. The combination with a component lead inserting machine having an inserter movable on a fixed operating axis, of automatic means for successively positioning lead receiving holes of at least one board predeterminedly in a plane and in exactly corresponding relation to said axis, said means comprising a board holding member constrained for X-Y movement in a plane normal to said axis and for selected angular rotation in either direction about a Z-axis parallel to said operating axis, said lead hole-positioning means including data-controlled power mechanism for selectively determining successive X-Y positions of the board holding member relative to the operating axis, and orienting mechanism responsive to operation of the data-controlled mechanism for automatically camming the member and the holes of the at least one board thereon to a predetermined angle about said Z-axis whereby component insertions may be differently oriented on each cammed circuit board or in successive cammed boards without removing either of two adjacent boards from said member.

10. The combination as in claim 9 wherein said orienting mechanism comprises at least one projection mounted in fixed relation to said member and movable to a predetermined Y-ordinate position a fixed distance from said operating axis, and means for caging the projection in said Y-ordinate position during operation of said data-controlled power mechanism to pivot said board holding member about an axis extending through said projection until the member occupies a selected angular position about the Z-axis.

11. The combination as in claim 10 wherein a plurality of said projections is arranged in equal spacing circumferentially, and the caging means comprises a yoke arranged to slidably enage the respective projections to constrain the engaged one of them for pivoting of the member about said engaged projection.

12. A machine for inserting coaxial leads of components into a predetermined pattern of spaced lead receiving holes preformed in circuit boards, said machine comprising a cyclical lead forming and inserting means operable along a first axis, a lead clinching means aligned with said axis for cutting and clinching end portions of the leads when projecting through said holes, a carriage mounted for X-Y movement in a plane normal to said first operating axis and between the inserting means and said clinching means, computer controlled means for positioning the carriage predeterminedly in said plane between operating cycles of the inserting means, a rotary board holding means mounted on the carriage for clockwise and counter-clockwise movement about a second axis parallel to said first operating axis, and mechanism responsive to X-Y programming of the computer controlled means for effecting rotation of the board holding means a predetermined angle about a third axis parallel to said first and second axes angularly to align the next lead receiving holes with respect to said first operating axis.

13. A machine as in claim 12 wherein said mechanism for rotating the board holding means comprises a projection therefrom and a yoke for slidably embracing the projection in response to operation of said computer controlled means.

14. In a machine for assembling components having leads to a printed circuit board, mechanism operable along an axis for inserting the leads of successive components in predetermined holes in the board, at least one cross slide-mounted disc rotatable in a plane substantially normal to said operating axis and angularly about an axis parallel to the operating axis, means on the disc for releasably holding the board, means for cooperating with the disc to permit its rotation in either of two directions and for releasably holding it in selected angular position, and computer controlled means operative between cycles of said mechanism for determining for successive components to be inserted (a) X-Y registration of the disc with the operating axis; (b) a selected angular rotation of the disc and hence of the board about that axis, and (c) actuation of a cycle of the inserting mechanism, the computer controlled means comprising, to effect the function specified in (b), a pivot means for the disc disposed between its periphery and the board holding means, and a member cooperative with the pivot means when the latter is located on a predetermined X or Y ordinate a fixed distance from said operating axis.

15. A machine as in claim 14 wherein said member is formed with a guideway parallel to said predetermined X or Y ordinate for restraining said pivot means from movement from said ordinate during rotation of the disc.

16. A machine as in claim 15 wherein the computer controlled means is programmed to move the pivot means to a predetermined point a fixed predetermined distance from said operating axis to enable engagement with said member, and during subsequent cooperation of the member and pivot means the computer controlled means is programmed to effect rotation of the disc 90° by causing its center to traverse a locus comprised of rectilinear portions disposed as angles consisting of 45° or a multiple of 45°.

* * * * *

UNITED STATES PATENT OFFICE
CERTIFICATE OF CORRECTION

Patent No. 4,080,730          Dated March 28, 1978

Inventor(s) Daniel W. Woodman, Jr.

It is certified that error appears in the above-identified patent and that said Letters Patent are hereby corrected as shown below:

Column 7, Line 49, after the word "one" insert --circuit--

Signed and Sealed this

Twenty-second Day of August 1978

[SEAL]

Attest:

RUTH C. MASON
Attesting Officer

DONALD W. BANNER
Commissioner of Patents and Trademarks